United States Patent [19]

Fukuhara

[11] Patent Number: 5,514,894
[45] Date of Patent: May 7, 1996

[54] PROTECTION CIRCUIT DEVICE FOR A SEMICONDUCTOR INTEGRATED CIRCUIT DEVICE

[75] Inventor: Naohiro Fukuhara, Kanagawa, Japan

[73] Assignee: NEC Corporation, Tokyo, Japan

[21] Appl. No.: 434,907

[22] Filed: May 3, 1995

Related U.S. Application Data

[63] Continuation of Ser. No. 25,749, Mar. 3, 1993, abandoned.

[30] Foreign Application Priority Data

Mar. 3, 1992 [JP] Japan .................................. 4-045095

[51] Int. Cl.⁶ .............................................. H01L 23/62
[52] U.S. Cl. ...................... 257/360; 257/362; 257/591; 257/497; 361/90; 361/68
[58] Field of Search ................................ 361/68, 90, 91, 361/92, 101; 257/362, 546, 497, 355, 591, 360, 361, 356

[56] References Cited

U.S. PATENT DOCUMENTS

| | | |
|---|---|---|
| 4,952,994 | 8/1990 | Lin .................................... 257/360 |
| 5,027,250 | 6/1991 | Cini et al. ......................... 361/90 |
| 5,061,649 | 10/1991 | Takenouchi et al. .............. 257/408 |
| 5,200,876 | 4/1993 | Takeda ............................ 361/91 |

FOREIGN PATENT DOCUMENTS

| | | | |
|---|---|---|---|
| 2-90669 | 3/1990 | Japan .................................. 257/355 |
| 4-94568 | 3/1992 | Japan .................................. 257/355 |

*Primary Examiner*—Jerome Jackson, Jr.
*Assistant Examiner*—John Guay
*Attorney, Agent, or Firm*—Young & Thompson

[57] ABSTRACT

A protection circuit structure for an internal semiconductor integrated circuit. The protection circuit structure includes a first protection circuit having at least a first input pin and a first discharge pin, a second protection circuit having at least a second input pin and a second discharge pin and a switching device connecting between the first and second protection circuits. The switching device is biased by a potential difference between the first and second discharge pins. The switching device permits operating one of the first and second protection circuits to accomplish a discharge in replacement of an inoperative first or second discharge pin. The switching device takes the ON state when biased by a predetermined voltage or higher which interrupts the internal semiconductor integrated circuit. The switching device connects between wiring lines which respectively connect to the first and second discharge pins.

1 Claim, 5 Drawing Sheets

PROTECTION CIRCUIT DEVICE FOR A SEMICONDUCTOR INTEGRATED CIRCUIT DEVICE

This application is a continuation of application Ser. No. 08/025,749, filed Mar. 3, 1993, now abandoned.

BACKGROUND OF THE INVENTION

The invention relates to a semiconductor integrated circuit device, and more particularly to a protection circuit device for an internal semiconductor integrated circuit device.

In general, many semiconductor integrated circuit devices are sometimes forced to suffer the danger of breakdown due to excessively high voltage. The semiconductor integrated circuit device tends to be charged by a static electricity thereby generating any excessively high voltage which is applied to the semiconductor integrated circuit devices. When the semiconductor integrated circuit device is in contact with an article or a human body or the like, an excessively high voltage which has been generated by the static electricity is applied to one or more input pins involved in the semiconductor integrated circuit device. The application of such excessively high voltage caused by the static electricity to the pins causes a relatively large current to be applied to the semiconductor integrated circuit device thereby resulting in a breakdown thereof.

Then, it is necessary to combat such problems in the breakdown of the semiconductor integrated circuit device caused by a discharge of the static electricity. Well known in the art to solve such problems is use of protection circuits which serve to protect the internal semiconductor integrated circuit device from exhibiting a breakdown. Thus, the protection circuit device keeps the internal semiconductor integrated circuit device from being supplied with any excessively high voltage caused by external factors such as the static electricity. To accomplish such protection feature, the protection circuit device involves a pin which is grounded to a ground potential. Such protection circuit device including the grounded pin is provided between the internal semiconductor integrated circuit device and each input pin thereof. When an excessively high voltage caused by the static electricity is applied to any of the input pins, the protection circuit device provided between the input pin and the internal semiconductor integrated circuit device makes a relatively large current caused by such excessively high voltage to be discharged through a grounded discharge pin so as to prevent the current to flow in the internal semiconductor integrated circuit device.

The conventional protection circuit device including a grounded pin for an internal semiconductor integrated circuit device will be described with reference to FIG. 1A. The conventional protection circuit device is arranged between an input pin 11 and an internal semiconductor integrated circuit device. FIG. 1A illustrates an equivalent circuit of the conventional protection circuit device. The equivalent circuit of the conventional protection circuit device has two resistances connected in series between the input pin 11 and the internal semiconductor integrated circuit device. The equivalent circuit of the conventional protection circuit device also has two transistors Q1 and Q2, both of which serve as switching devices. The transistor Q1 is connected at its gate electrode between the resistance and the input pin 11. The transistor Q1 at one of its source and drain electrodes is also connected to one of the resistances which exists between another resistance and the input pin 11. The transistor Q1 at another of the source and drain electrodes is also connected to a grounded pin 13 which supplies the ground potential. The transistor Q2 is connected at its gate electrode between the grounded pin 13 and the another of the source and drain electrodes of the transistor Q1. The transistor Q2, also at one electrode of its source and drain electrodes, is connected to the another of the resistances. The transistor Q2 also at another of the source and drain electrodes is connected between the grounded pin 13 and the another of the source and drain electrodes of the transistor Q1.

The operation of the equivalent circuit of the conventional protection circuit device will be described with reference to the equivalent circuit. When a positive excessively high voltage caused by external factors such as the static electricity is applied to the input pin 11, the transistor Q1 is biased in the forward direction by such positive high voltage and further its gate is also supplied with such positive high voltage. As a result, the transistor Q1 turns ON. Thus, a relatively large current caused by such positive high voltage flows from the input pin 11 through the transistor Q1 to the grounded pin 13 as the grounded pin 13 supplies the ground potential. Namely, the transistor Q1 serving as a switching device forces the relatively large current be discharged through the grounded pin 13. This prevents such current to flow in the internal semiconductor integrated circuit device. The protection circuit device is, therefore, able to make the internal semiconductor integrated circuit be free from a breakdown caused by the application of the large current.

In contrast, when a negative excess high voltage is applied to the input pin 11, the transistor Q1 is biased but in the reverse direction by such negative high voltage and further its gate is also supplied with such negative high voltage. As a result, the transistor Q1 remains OFF. However, the transistor Q2 is biased in the forward direction by such negative high voltage and further its gate is also supplied with such negative high voltage. As a result, the transistor Q2 turns ON. Thus, a relatively large current of negative carriers or electrons caused by such negative high voltage flows from the input pin 11 to the grounded pin 13 but through the transistor Q2. Namely, the transistor Q2 serving as a switching device forces the relatively large current of negative carriers or electrons to be discharged through the grounded pin 13 which supplies the ground potential. This prevents such current to flow in the internal semiconductor integrated circuit device. The protection circuit device is, therefore, able to make the internal semiconductor integrated circuit be free from a breakdown caused by the application of the large current.

In recent years, the semiconductor integrated circuit device is required to have a large capacity and multiple functions. Developments in the large capacity and the multiple functions make the semiconductor integrated circuit device have a plurality of protection circuits independent from each other, each of which has a grounded discharge pin. The grounded discharge pins involved in the protection circuit devices are made to be independent from each other and thus are not connected to each other. Namely, a plurality of protection circuit devices, each of which has a grounded pin, are electrically separated from one another.

Such a semiconductor integrated circuit device has the following disadvantages. When each of the independent protection circuit devices involved in the semiconductor integrated circuit device is normally operative, of course there exists no problem. But, if a disconnection of one of the plural grounded pins from the ground occurs, the grounded discharge pin 13 disconnected from the ground assumes a floating state as illustrated in FIG. 1B. The protection circuit device having the floating discharge pin 13 is unable to exhibit a normal performance as a protection circuit. Since such floating discharge pin 13 is also unable to supply the ground potential. Then, in the protection circuit device including the floating discharge pin 13, if a positive or negative excessively high voltage caused by the static electricity is applied to the input pin 11, a relatively large current generated by the positive or negative excess high voltage is unable to be discharged through the floating discharge pin 13. Thus, the floating discharge pin 13 forces the large current to flow through the two resistances to the internal semiconductor integrated circuit device. The application of the large current to the internal semiconductor integrated circuit device causes the failure of any elements such as a transistor involved in the internal semiconductor integrated circuit device. Such internal semiconductor integrated circuit device including any failed element no longer exhibits a normal performance. The important problem with the floating pin 13 is as follows. If only one of the plural grounded pins provided to the single internal semiconductor integrated circuit device takes a floating state, the single internal semiconductor integrated circuit device suffers the application of the large current thereby resulting in losing a normal performance. Even if all the other pins are grounded and are able to supply the ground potential, the floating of only one of the plural grounded pins forces the internal semiconductor integrated circuit device to be supplied with a large current thereby losing its normal performance. This makes the internal semiconductor integrated circuit device having a plurality of discharge pins suffer a high possibility a danger of losing the normal performance due to the failure of the elements.

To combat the above disadvantage, it is desirable to provide a novel structure of the protection circuit device which is able to exhibit a protective performance for the internal semiconductor integrated circuit device, even if one of the plural discharge pins takes a floating state.

SUMMARY OF THE INVENTION

Accordingly, it is a primary object of the present invention to provide a novel protection circuit device for an internal semiconductor integrated circuit device having a plurality of discharge pins.

It is a further object of the present invention to provide a novel protection circuit device which is able to exhibit a protection performance, even if one of discharge pins assumes a floating state.

It is a further object of the present invention to provide a novel protection circuit device which is able to prevent a large current caused by any positive or negative excessively high voltage to flow in an internal semiconductor integrated circuit device, even if one of the discharge pins assumes a floating state.

It is a still further object of the present invention to provide a novel protection circuit device which is able to force a large current caused by any positive or negative excessively high voltage to be discharged through another grounded discharge pin, if one of discharge pins assumes a floating state.

It is another object of the present invention to provide a novel switching device involved in a protection circuit, which makes a large current caused by any positive or negative excessively high voltage applied to an input pin flow through another grounded pin which has an ability to supply the ground potential, if one of the grounded pins assumes a floating state.

The above and other objects, features and advantages of the present invention will be apparent from the following descriptions.

The present invention provides a novel protection circuit structure for an internal semiconductor integrated circuit. The protection circuit structure includes a first protection circuit having at least a first input pin and a first discharge pin. The protection circuit structure also includes a second protection circuit having at least a second input pin and a second discharge pin. The protection circuit structure also includes a switching device which connects between the first and second protection circuits. The switching device is biased by a potential difference between the first and second discharge pins. The switching device permits operating one of the first and second protection circuits to accomplish a discharge in replacement of an inoperative another of the first and second discharge pins. The switching device takes ON state when biased by a predetermined voltage or higher which makes the internal semiconductor integrated circuit fail. The switching device also connects between wiring lines which respectively connect to the first and second discharge pins.

The present invention also intends to provide a semiconductor switching device involved in a protection circuit device for an internal semiconductor integrated circuit in which the protection circuit device includes a plurality of protection circuits. The switching device includes a semiconductor substrate of a first conductive type. The switching device also includes first and second diffusion layers of a second conductive type formed separately and near each other in a surface region of the semiconductor substrate. The switching device also includes an insulation film formed on surfaces of the first and second diffusion layers and the semiconductor substrate. The switching device also includes first and second electrodes formed on the first and second diffusion layers respectively in which the first and second electrodes are respectively connected to first and second ones of the plural protection circuits. Further, the first and second diffusion layers respectively include third and fourth diffusion layers of the second conductive type in surface regions directly under the first and second electrodes. The third and fourth diffusion layers have a higher dopant concentration than that of the first and second diffusion layers.

The present invention also intends to provide another semiconductor switching device involved in a protection circuit device for an internal semiconductor integrated circuit in which the protection circuit device includes a plurality of protection circuits. The switching device includes a semiconductor substrate of a first conductive type. The switching device also includes first and second diffusion layers of a second conductive type formed separately and near each other in a surface region of the semiconductor substrate. The switching device also includes an insulation film formed on surfaces of the first and second diffusion layers and the semiconductor substrate. The switching device also includes first and second electrodes formed on the first and second diffusion layers respectively in which the first and second electrodes are respectively connected to first and second ones of the plural protection circuits. The switching device also includes first and second gate electrodes formed on the insulation film. The first and second gate electrodes are respectively connected to the first and second electrodes. The first and second gate electrodes are also spaced from each other along a direction of a channel width.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1A:
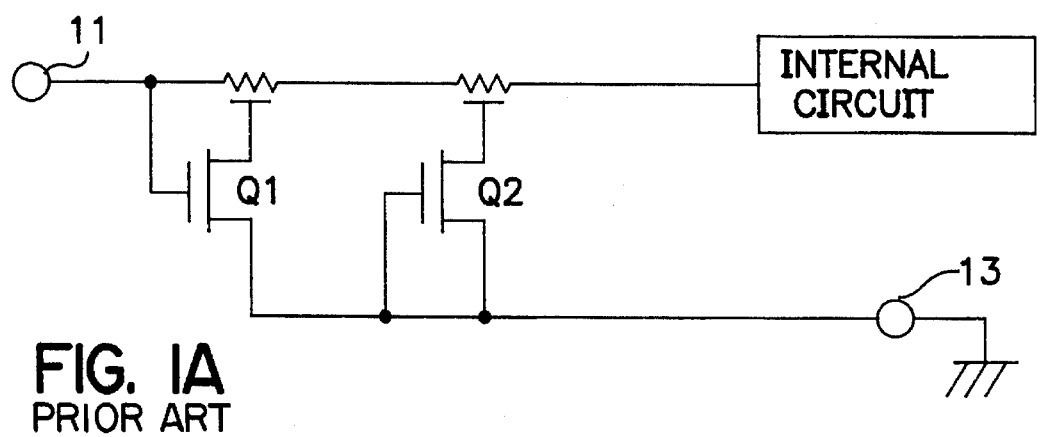
FIG. 1A is a circuit diagram illustrative of an equivalent circuit of the conventional protection circuit device for the internal semiconductor integrated circuit device when a discharge pin is grounded.
Figure 1B:
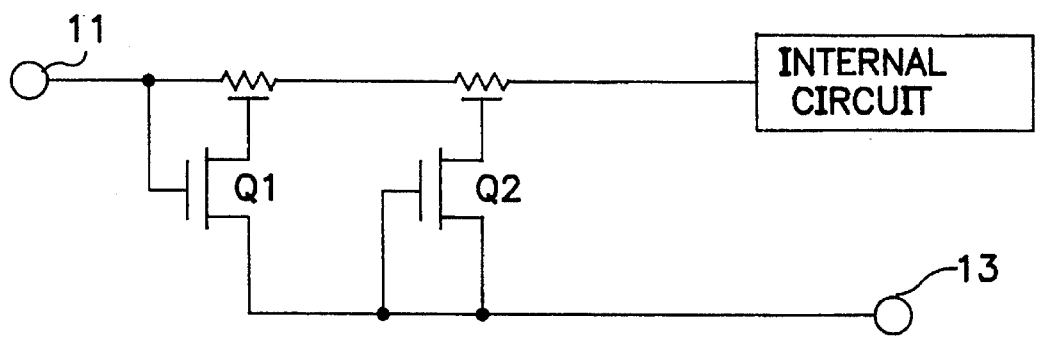
FIG. 1B is a circuit diagram illustrative of an equivalent circuit of the conventional protection circuit device for the internal semiconductor integrated circuit device when a discharge pin takes a floating state.

The present invention provides a novel protection circuit structure. The novel protection circuit device comprises a first protection circuit and a second protection circuit, both of which are connected to each other through a switching device. The first and second protection circuits have the same structure as each other, each of which has an analogous structure to that of the conventional protection circuit device. The novel protection circuit device is, however, completely different from that of the prior art in the following matters. In the prior art the plural protection circuits are electrically independent and thus separated from each other. In contrast, in the novel protection circuit device according to the present invention, the plural protection circuits are electrically connected to each other.

A first embodiment of the present invention will be described with reference to FIGS. 2A, 2B, 3A and 3B. A structure of a novel protection circuit device of the first embodiment according to the present invention will be described by using an equivalent circuit illustrated in FIG. 2A. The novel protection circuit device comprises a first protection circuit 100 and a second protection circuit 101, both of which are connected to each other through a switching device Q5.

The first protection circuit 100 is arranged between an input pin 11 and an internal semiconductor integrated circuit device. The first protection circuit 100 has two resistances R1 and R2 connected in series between the input pin 11 and the internal semiconductor integrated circuit device. The first protection circuit 100 also has two transistors Q1 and Q2, both of which serve as switching devices. The transistor Q1 is connected at its gate electrode between the resistance R1 and the input pin 11. The transistor Q1 at one of its source and drain electrodes is also connected to the resistance R1. The transistor Q1 at another of its source and drain electrodes is also connected to a wiring line 6a which connects to a discharge pin 13. The discharge pin 13 is so grounded as to supply the ground potential. The transistor Q2 is connected at its gate electrode to the wiring line 6a. The transistor Q2 also at one electrode of its source and drain electrodes is connected to the resistance R2. The transistor Q2 also at another electrode of its source and drain electrodes is connected to the wiring line 6a.

The second protection circuit 101 is arranged between an input pin 12 and an internal semiconductor integrated circuit device. The second protection circuit 101 has two resistances R3 and R4 connected in series between the input pin 12 and the internal semiconductor integrated circuit device. The second protection circuit 101 also has two transistors Q4 and Q3, both of which serve as switching devices. The transistor Q4 is connected at its gate electrode between the resistance R4 and the input pin 12. The transistor Q4 at one of its source and drain electrodes is also connected to the resistance R4. The transistor Q4 at another of its source and drain electrodes is also connected to a wiring line 6b which connects to a discharge pin 14. The discharge pin 14 is so grounded as to supply the ground potential. The transistor Q3 is connected at its gate electrode to the wiring line 6b. The transistor Q3 also at one electrode of its source and drain electrodes is connected to the resistance R3. The transistor Q3 also at another electrode of its source and drain electrodes is connected to the wiring line 6b.

The first and second protection circuits 100 and 101 are electrically connected to each other through the switching device Q5. The switching device Q5 may be regarded as a transistor in view of the equivalent circuits. Such transistor Q5 serving as the switching device is so designed that a gate always takes a substrate potential. Then, the gate electrode is directly connected to the semiconductor substrate. One of source and drain electrodes of the switching device Q5 is connected to the wiring line 6a of the first protection circuit 100 so as to take the same potential as that of the discharge pin 13. Another of the source and drain electrodes of the switching device Q5 is also connected to the wiring line 6b of the second protection circuit 101 so as to take the same potential as that of the discharge pin 14. Then, the switching device Q5 may also be regarded as a diode as having two effective electrodes and one ineffective electrode. Such switching device Q5 is biased by a potential difference of the discharge pins 13 and 14 of the first and second protection circuits 100 and 101, respectively. Namely, the bias to be applied to the switching device Q5 is defined by the potential difference between the discharge pins 13 and 14. The switching device Q5 is so operated as to take ON state only when the bias voltage applied to the switching device Q5 is larger than a predetermined voltage. When the bias voltage applied to the switching device Q5 is smaller than the predetermined voltage, the switching device Q5 takes OFF state. The absolute value of the predetermined voltage is so determined as to match a positive or negative excessively high voltage caused by external factors such as the static electricity. Namely, the switching device Q5 is so designed as to turn ON by an application of a bias voltage corresponding to the excessively high voltage caused by the static electricity.

Figure 2A:
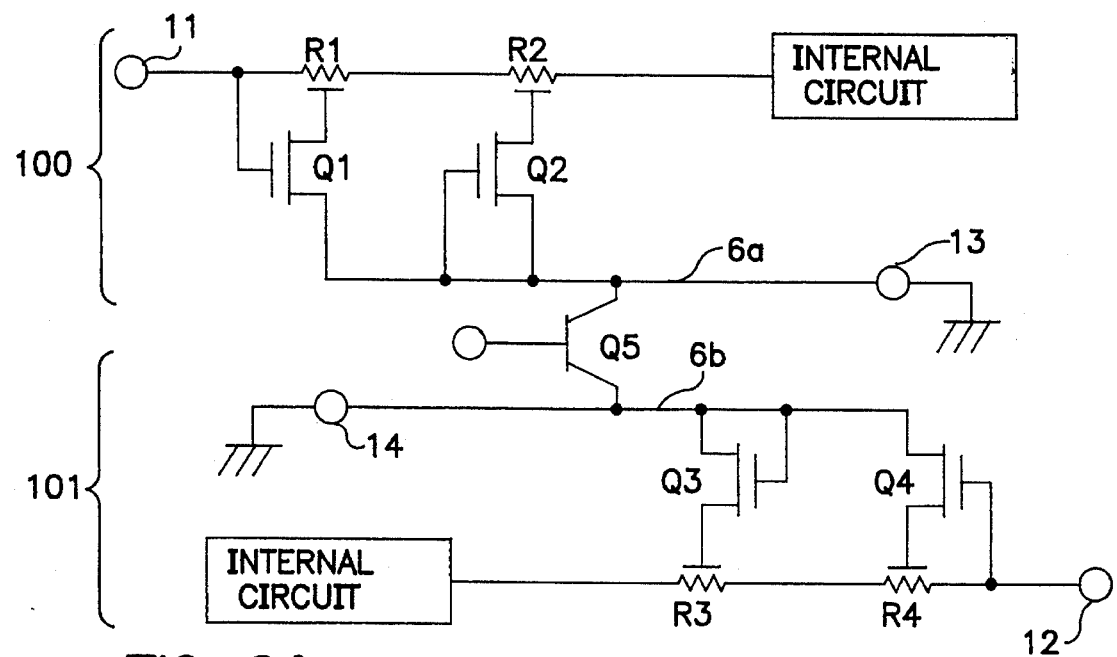
FIG. 2A is a circuit diagram illustrative of an equivalent circuit of a novel protection circuit device when all discharge pins are grounded in a first embodiment according to the present invention.
Figure 2B:
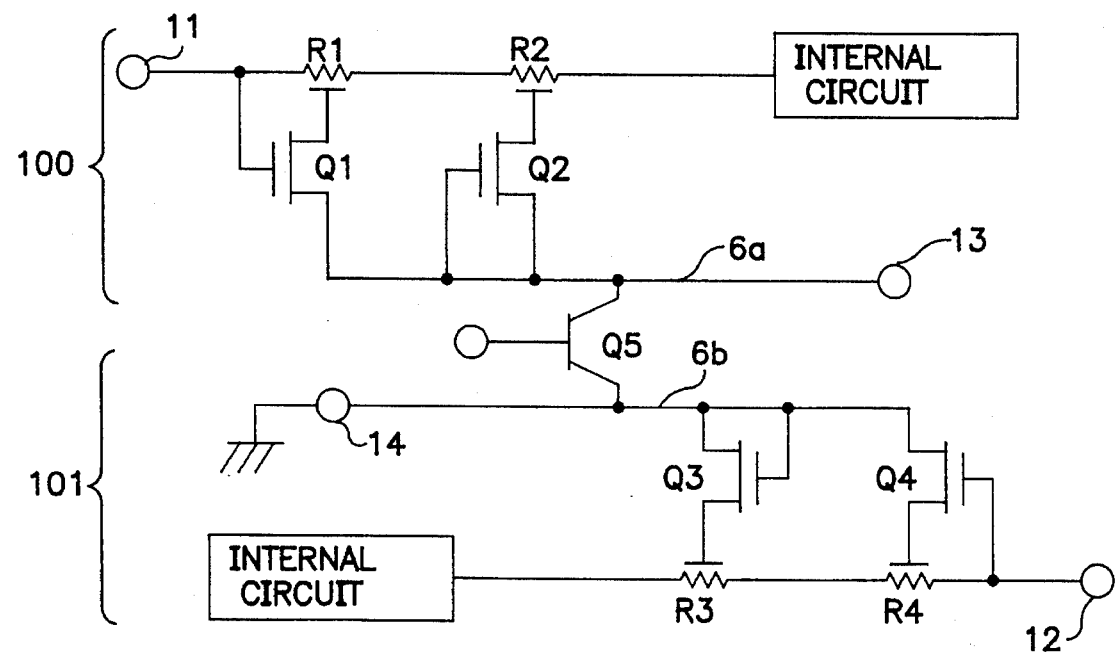
FIG. 2B is a circuit diagram illustrative of an equivalent circuit of a novel protection circuit device when a discharge pin takes a floating state and an adjacent discharge pin is grounded in a first embodiment according to the present invention.

A normal performance of the novel protection circuit device will be described with reference to FIG. 2A. Under a normal state, both the discharge pin 13 and the discharge pin 14 are grounded.

In the first protection circuit 100, when a positive excessively high voltage caused by external factors such as the static electricity is applied to the input pin 11, the transistor Q1 is biased in the forward direction by such positive high voltage and further its gate is also supplied with such positive high voltage. As a result, the transistor Q1 turns ON. Thus, a relatively large current caused by such positive high voltage flows from the input pin 11 through the transistor Q1 and the wiring line 6a to the grounded discharge pin 13 because the grounded discharge pin 13 supplies the ground potential. Namely, the transistor Q1 serving as a switching device forces the relatively large current caused by applying the positive excessively high voltage to be discharged through the grounded discharge pin 13. This prevents this current from flowing in the internal semiconductor integrated circuit device. Under the normal state, the first protection circuit 100 is, therefore, independtly able to make the internal semiconductor integrated circuit be free from a breakdown caused by the application of the large current.

In contrast, when a negative excessively high voltage is applied to the input pin 11, the transistor Q1 is biased but in the reverse direction by such negative high voltage and further its gate is also supplied with such negative high voltage. As a result, the transistor Q1 remains OFF. However, the transistor Q2 is biased in the forward direction by such negative high voltage and further its gate is also supplied with such negative high voltage. As a result, the transistor Q2 turns ON. Thus, a relatively large current of negative carriers or electrons caused by such negative high voltage flows from the input pin 11 to the grounded discharge pin 13 but through the transistor Q2 and the wiring line 6a. Namely, the transistor Q2 serving as a switching device forces the relatively large current of negative carriers or electrons caused by applying the negative excess high voltage to be discharged through the grounded discharge pin 13 which supplies the ground potential. This prevents this current from flowing in the internal semiconductor integrated circuit device. Under the normal state, the first protection circuit 100 is, therefore, independently able to make the internal semiconductor integrated circuit be free from a breakdown caused by the negative excess high voltage.

In the second protection circuit 101, when a positive excess high voltage caused by external factors such as the static electricity is applied to the input pin 12, the transistor Q4 is biased in the forward direction by such positive high voltage and further its gate is also supplied with such positive high voltage. As a result, the transistor Q4 turns ON. Thus, a relatively large current caused by such positive high voltage flows from the input pin 12 through the transistor Q4 and the wiring line 6b to the grounded discharge pin 14 because the grounded discharge pin 14 supplies the ground potential. Namely, the transistor Q4 serving as a switching device forces the relatively large current caused by applying the positive excess high voltage to be discharged through the grounded pin 14. This prevents this current from flowing in the internal semiconductor integrated circuit device. Under the normal state, the second protection circuit 101 is, therefore, independently able to make the internal semiconductor integrated circuit be free from a breakdown caused by the application of the large current.

In contrast, when a negative excessively high voltage is applied to the input pin 12, the transistor Q4 is biased but in the reverse direction by such negative high voltage and further its gate is also supplied with such negative high voltage. As a result, the transistor Q4 remains OFF. However, the transistor Q3 is biased in the forward direction by such negative high voltage and further its gate is also supplied with such negative high voltage. As a result, the transistor Q3 turns ON. In this description, for convenience, it is assumed that a current carrier is a negative charge current or an electron current, which is different from when the positive voltage is applied. Thus, a relatively large current of negative carriers or electrons caused by such negative high voltage flows from the input pin 12 to the grounded discharge pin 14 but through the transistor Q3 and the wiring line 6b. Namely, the transistor Q3 serving as a switching device forces the relatively large current of negative carriers or electrons caused by applying the negative excessively high voltage to be discharged through the grounded discharge pin 14 which supplies the ground potential. This prevents this current from flowing in the internal semiconductor integrated circuit device. Under the normal state, the second protection circuit 101 is, therefore, independently able to make the internal semiconductor integrated circuit be free from a breakdown caused by the negative excessively high voltage.

Consequently, under the normal state, the first and second protection circuits 100 and 101 are operative independently without an operation of the switching device Q5 connected between the grounded discharge pins 13 and 14. Thus, under the normal state, switching by device Q5 is not performed. The above normal state, therefore, permits the protection circuit device of the present invention to exhibit a protection function without operation of the switching device Q5.

However, an abnormal state does not permit the protection circuit device to exhibit a protection function without operation of the switching device Q5. The operation of the protection circuit device under the abnormal state will be described with reference to FIG. 2B.

Under the abnormal state, the discharge pin 13 is not grounded and thus, floats, while the discharge pin 14 is grounded. In such a case, the floating discharge pin 13 is unable to supply the ground potential, although the grounded discharge pin 14 is able to supply the ground potential. Then, the first protection circuit 100 is no longer able to exhibit a protection performance independently, while the second protection circuit 101 is able to exhibit a protection performance.

When a positive excessively high voltage caused by external factors such as the static electricity is applied to the input pin 11, the transistor Q1 is biased in the forward direction by such positive high voltage and further its gate is also supplied with such positive high voltage. As a result, the transistor Q1 turns ON. Thus, a relatively large current caused by such positive high voltage flows from the input pin 11 through the transistor Q1 and further on a wiring line 6a connecting to the floating discharge pin 13. The floating discharge pin 13 is, however, unable to discharge the current as being not grounded and thus floating. As a result, the positive excessively high voltage is applied on the wiring line 6a and to the floating discharge pin 13. In contrast, the grounded discharge pin 14 is able to supply the grounded potential because it is grounded, even if a positive or negative excessively high voltage is applied to the input pin 12. Consequently, the switching device Q5 is biased by the positive excessively high voltage which has been applied to the input pin 11. As described above, since the switching device was so designed as to turn ON only when biased by such positive or negative excessively high voltage, the switching device Q5 turns ON. The turning ON of the switching device Q5 makes the current flow from the wiring line 6a connecting to the floating discharge pin 13 to a wiring line 6b connecting to the grounded discharge pin 14 through the switching device Q5. Since the grounded discharge pin 14 is so grounded as to supply the ground potential as described above, the current flows to the grounded discharge pin 14 and then is discharged through the grounded discharge pin 14.

Eventually, the above switching device Q5 permits the relatively large current caused by the positive excessively high voltage applied to the input pin 11 to be discharged through the grounded discharge pin 14. Even if the excessively high voltage which should be discharged is applied to the inoperative first protection circuit 100, the novel protection circuit device including the switching device Q5 which connects between the first and second protection circuits 100 and 101 is able to accomplish the discharge of the current by using the operative second protection circuit 101 without using the inoperative protection circuit 100. This prevents the internal semiconductor integrated circuit provided with the inoperative protection circuit 100 to be supplied with the large current. This makes the internal semiconductor integrated circuit provided with the inoperative first protection circuit 100 free from the breakdown due to an application of the large current. The novel protection circuit device is able to exhibit the protection performance, even if the excessively high voltage caused by the external factors such as the static electricity is supplied not only to the operative second protection circuit 101 but also to the inoperative first second protection circuit 101 but also to the inoperative first protection circuit 100.

When an negative excessively high voltage is supplied to the input pin 11, the transistor Q1 is biased but in the reverse direction by such negative high voltage and further its gate is also supplied with such negative high voltage. As a result, the transistor Q1 remains OFF. However, the transistor Q2 is biased in the forward direction by such negative high voltage and further its gate is also supplied with such negative high voltage. As a result, the transistor Q2 turns ON. In this description, for convenience, it is assumed that a current carrier is a negative carrier current or an electron current, which is different from when the positive voltage is applied. Thus, a relatively large current of negative carriers or electrons caused by such negative high voltage flows from the input pin 11 through the transistor Q1 and further on a wiring line 6a connecting to the floating discharge pin 13. The floating discharge pin 13 is, however, unable to discharge the current as being not grounded and thus floats. As a result, the negative excessively high voltage is supplied on the wiring line 6a and to the floating discharge pin 13. In contrast, the grounded discharge pin 14 is able to supply the ground potential as being grounded, even if a positive or negative excessively high voltage is supplied to the input pin 12. Accordingly, the switching device Q5 is biased by the negative excessively high voltage which has been supplied to the input pin 11. As described above, since the switching device Q5 was so designed as to turn ON only when biased by such negative excessively high voltage, the switching device Q5 turns ON. The turning ON of the switching device Q5 makes the current flow from the wiring line 6a connecting to the floating discharge pin 13 to the wiring line 6b connecting to the grounded discharge pin 14 through the switching device Q5. Since the grounded discharge pin 14 is so grounded as to supply the ground potential as described above, the current flows to the grounded discharge pin 14 and then is discharged through the grounded discharge pin 14.

Eventually, the above switching device Q5 permits the relatively large current caused by the negative excessively high voltage supplied to the input pin 11 to be discharged through the grounded discharge pin 14. Even if the excessively high voltage which should be discharged is supplied to the inoperative first protection circuit 100, the novel protection circuit device including the switching device Q5 is able to accomplish the discharge of the current by using the operative second protection circuit 101 without using the inoperative protection circuit 100. This prevents the internal semiconductor integrated circuit provided with the inoperative protection circuit 100 to be supplied with the large current. This makes the internal semiconductor integrated circuit provided with the inoperative first protection circuit 100 free from the breakdown due to an application of the large current. The novel protection circuit device is, therefore, able to exhibit the protection performance, even if the excessively high voltage caused by the external factors such as the static electricity is supplied not only to the operative second protection circuit 101 but also to the inoperative first protection circuit 100.

Accordingly, from the above descriptions of the first embodiment, it can be understood that the novel protection circuit device is able to exhibit the protection performance, when either positive or negative excessively high voltage is supplied to the inoperative protection circuit 100.

Figure 3A:
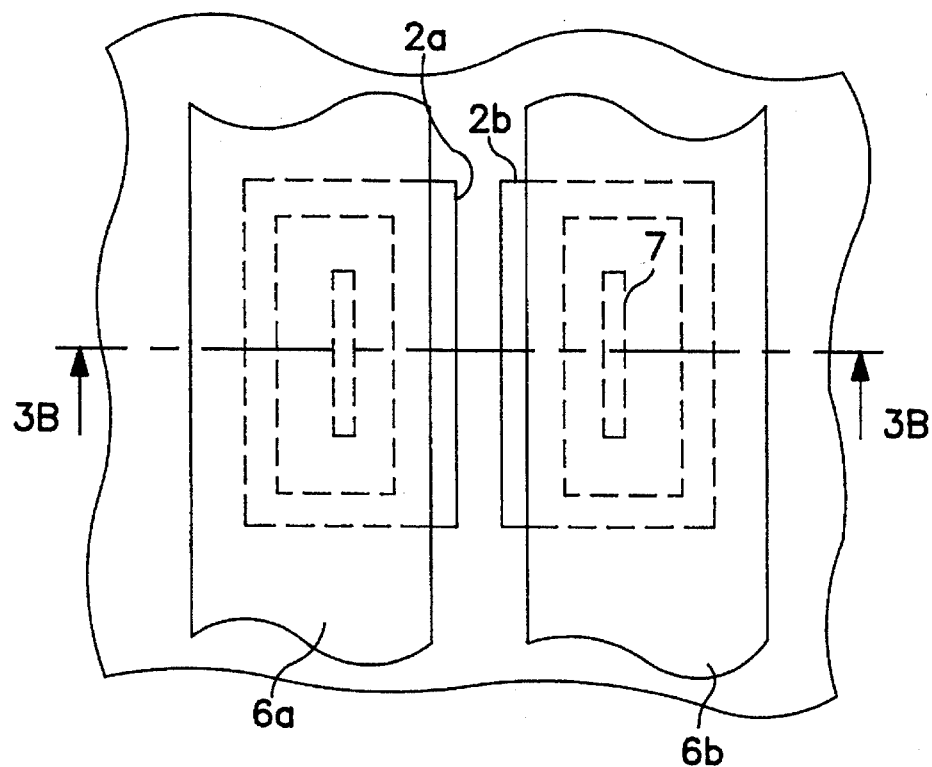
FIG. 3A is a plan view illustrative of a novel semiconductor switching device involved in a protection circuit device in a first embodiment according to the present invention.
Figure 3B:
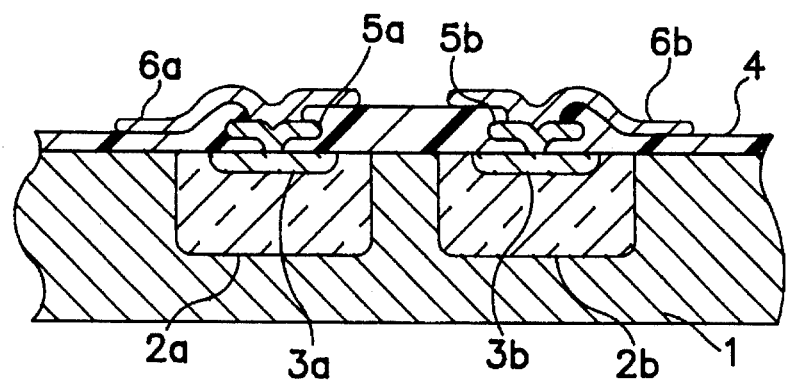
FIG. 3B is a fragmentary cross sectional elevation view taken along A-A' line, which is illustrative of a novel semiconductor switching device involved in a protection circuit device in a first embodiment according to the present invention.
Figure 4A:
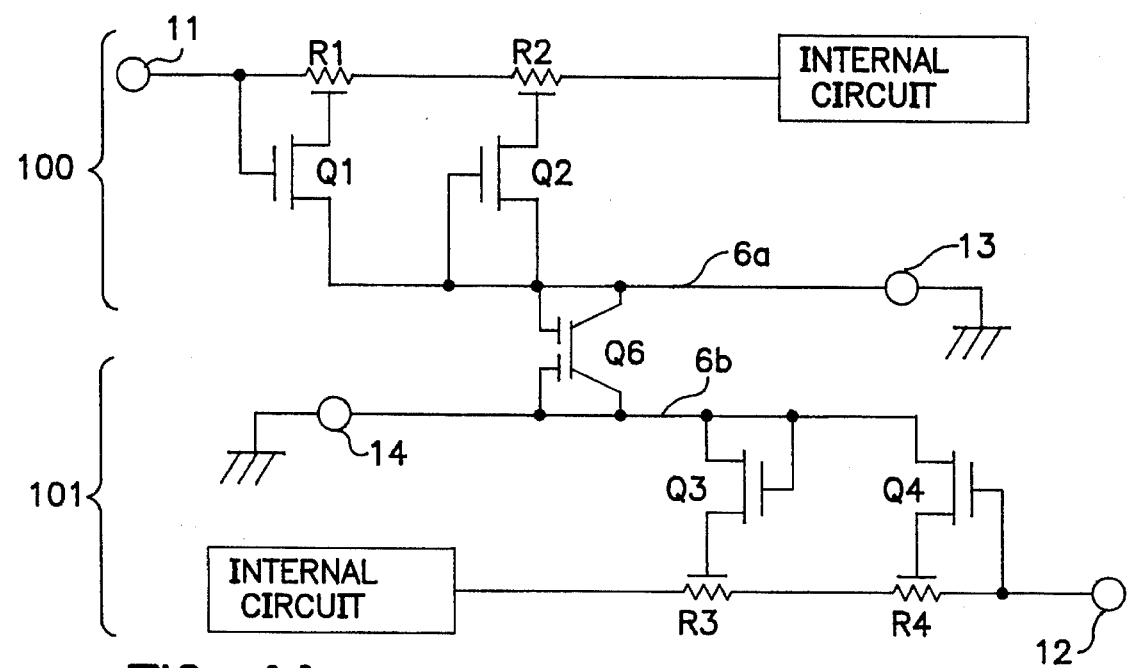
FIG. 4A is a circuit diagram illustrative of an equivalent circuit of a novel protection circuit device when all discharge pins are grounded in a second embodiment according to the present invention.
Figure 4B:
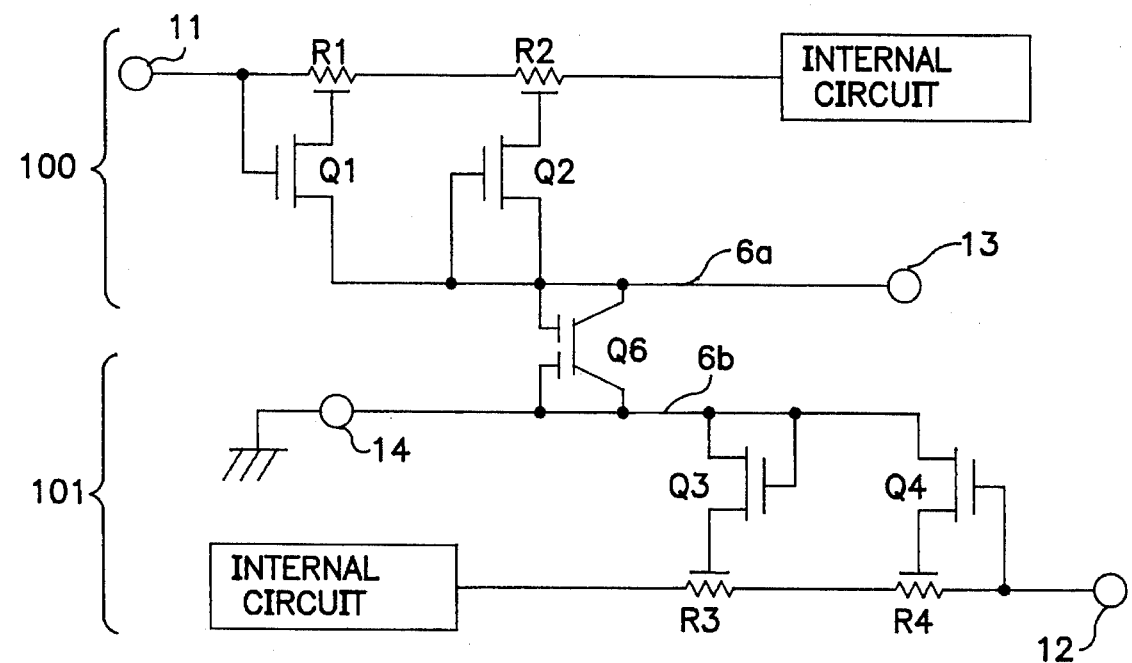
FIG. 4B is a circuit diagram illustrative of an equivalent circuit of a novel protection circuit device when a discharge pin takes a floating state and an adjacent discharge pin is grounded in a second embodiment according to the present invention.

In addition, the novel switching device Q5 as an important element involved in the protection circuit device of the first embodiment will be described with reference to FIGS. 3A and 3B. As can be understood from the above descriptions, it is required that the above switching device Q5 is operative against both positive and negative bias voltage. Thus, the switching device Q5 is operated by biases in opposite directions, or forward and reverse directions. Further, the switching device Q5 is required to exhibit a turning ON performance only when supplied with a positive or negative excessively high voltage generated by external factors such as the static electricity.

The structure of the novel switching device Q5 of the first embodiment according to the present invention will be described with reference to FIGS. 3A and 3B. The switching device Q5 has a p-type silicon substrate 1. Diffusion layers 2a and 2b doped with an n-type dopant are formed on a main surface of the p-type silicon substrate 1. The n-type diffusion layers 3a and 3b are also so formed as to be separate from but near to each other. The distance between the n-type diffusion layers 2a and 2b is determinative of a threshold voltage of the switching device Q5. The switching device turns ON when biased by a threshold voltage or more. When the distance between the n-type diffusion layers 2a and 2b is short, the switching device Q5 has a low threshold voltage. In contrast, when the distance between the n-type diffusion layers 2a and 2b is large, the switching device Q5 has a high threshold voltage. The distance between the n-type diffusion layers 2a and 2b are so determined as to match variable bias conditions. Namely, the distance between the n-type diffusion layers 2a and 2b is so determined that the switching device Q5 turn ON when biased by a positive or negative excessively high voltage caused by external factors such as the static electricity.

Diffusion layers 3a and 3b doped with the n-type dopant are respectively formed in surfaces of the n-type diffusion layers. Each of the n$^+$-type diffusion layers 3a and 3b has a higher dopant concentration than that of the n-type diffusion layers 2a and 2b. An insulation film 4 is formed on an entire surface of the device. Contact holes are respectively formed in portions of the insulation film 4 directly over the n$^+$-type diffusion layers 3a and 3b. Electrodes 5a and 5b which are made of a polycrystalline silicon film are respectively formed in the contact holes so as to contact with the n$^+$-type diffusion layers 3a and 3b. The high dopant concentration of the n$^+$-type diffusion layers 3a and 3b permits reducing the contact resistance possessed by each junction between the n$^+$-type diffusion layer 3a or 3b and the electrode 5a or 5b. The electrodes 5a and 5b are separated by the insulation film 4. Further, wirings 6a and 6b are formed on the insulation film 4 so as to contact with the electrodes 5a and 5b respectively, but not to contact with each other. Thus, the wirings 6a and 6b are separated from each other. Further, the wirings 6a and 6b are respectively connected to the grounded discharge pins 13 and 14 which are not illustrated in FIGS. 3A and 3B.

The operation of the switching device Q5 under the abnormal state of the protection circuit device of the first embodiment will be described with reference to FIGS. 3A and 3B.

The wiring 6a takes the same potential as that of the discharge pin 13 because it is connected to the discharge pin 13. When the discharge pin 13 is not grounded and thus floats, the wiring 6a takes the same potential as the excessively high voltage applied to the input pin 11. In contrast, the wiring 6b takes the same potential as that of the discharge pin 14 because it is connected to the discharge pin 14. When the discharge pin 13 is grounded to supply the ground potential, wiring 6b takes the ground potential because it is connected to the grounded discharge pin 14.

Under the zero bias condition, potential barriers or space charge regions exist at the p-n junction interfaces between the p-type silicon substrate 1 and the n-type diffusion layers 2a and 2b. Carriers or electrons are unable to move across the p-n junction interfaces. Thus, the switching device exhibits no current between the n-type diffusion layers 2a and 2b. Then, under the zero bias condition, the switching device Q5 takes the OFF state.

When the positive excessively high voltage is applied to the input pin 11, the wiring 6a also takes a positive high potential corresponding to the positive excessively high voltage as the discharge pin 13 floats. The diffusion layer 2a also takes the positive high potential. In contrast, since the discharge pin 14 is grounded, the wiring 6b takes the ground potential. Consequently, the p-n junction interface between the n-type diffusion layer 2a and the p-type silicon substrate 1 is biased but in the reverse direction. The reverse bias applied to the p-n junction interface makes the space charge region wide. When the space charge region reaches the n-type diffusion layer 2b, negative carriers or electrons flow from the n-type diffusion layer 2b to the n-type diffusion layer 2a. Thus, the current flows between the n-type diffusion layers 2a and 2b.

In view of the energy band, the above mechanism will be described. Under the no bias condition, an energy band of the p-type substrate region 1 lies above energy bands of the n-type diffusion layers 2a and 2b. The energy bands of the n-type diffusion layers 2a and 2b lie at the same level. Then, negative carriers or electrons experience a potential barrier in moving from the n-type diffusion layer 2a or 2b to the p-type silicon substrate 1 through the p-n junction interface. Then, negative carriers are unable to climb over a hill region of the energy band of the p-type silicon substrate region 1.

When the reverse bias is applied to the p-n junction between the p-type silicon substrate 1 and the n-type diffusion layer 2a and thus when the n-type diffusion layer 2a takes a positive high potential, the energy band of the n-type diffusion layer 2a is lowered. The energy bands of the p-type silicon substrate region 1 and the n-type diffusion layer 2b remain. Then, the difference in level between the energy bands of the n-type diffusion layer 2a and the p-type silicon substrate region 1 is enlarged. A sloped region of the energy band or the space charge region becomes wide. The width of the space charge region depends upon the voltage level applied to the n-type diffusion layer 2a. When the positive excessively high voltage is applied to the n-type diffusion layer 2a, the hill region of the energy band of the p-type silicon substrate region 1 is deformed. At this time, the space charge region occupies the space between the n-type diffusion layers 2a and 2b. The energy bands of the n-type diffusion layers 2a and 2b are connected through a sloped energy band region representing the space charge region. Since the energy band of the n-type diffusion layer 2b exists above the energy band of the n-type diffusion layer 2a, negative carriers or electrons move down on the sloped energy band region from the n-type diffusion layer 2b to the n-type diffusion layer 2a. Accordingly, the current of negative carriers flows from the n-type diffusion layer 2b to the n-type diffusion layer 2a thereby the switching device Q5 turns ON.

When the negative excessively high voltage is applied to the input pin 11, the wiring 6a also takes an negative high potential corresponding to the negative excessively high voltage as the discharge pin 13 floats. The diffusion layer 2a also takes the positive high potential. In contrast, since the discharge pin 14 is grounded, the wiring 6b takes the ground potential. Consequently, the p-n junction interface between the n-type diffusion layer 2a and the p-type silicon substrate 1 is biased in the forward direction. The forward bias applied to the p-n junction interface makes the space charge region narrow. When the space charge region becomes narrow, negative carriers or electrons flow from the n-type diffusion layer 2a to the n-type diffusion layer 2b. Thus, the current flows between the n-type diffusion layers 2a and 2b.

In view of the energy band, the above mechanism will be described. When the forward bias is applied to the p-n junction between the p-type silicon substrate 1 and the n-type diffusion layer 2a and thus when the n-type diffusion layer 2a takes a negative high potential, the energy band of the n-type diffusion layer 2a is raised. The energy bands of the p-type silicon substrate region 1 and the n-type diffusion layer 2b remain. Then, the difference in level between the energy bands of the n-type diffusion layer 2a and the p-type silicon substrate region 1 is reduced. A sloped region of the energy band or the space charge region becomes gentle and narrow. The width of the space charge region depends upon the voltage level applied to the n-type diffusion layer 2a.

When the negative excessively high voltage is applied to the n-type diffusion layer 2a, the energy band level is raised to a near or high level as compared to the energy band level of the p-type silicon substrate region 1. Namely, the potential barrier or the energy band hill of the p-type region disappears. Since the energy band of the n-type diffusion layer 2a exists above the energy band of the n-type diffusion layer 2b, negative carriers or electrons move from the n-type diffusion layer 2a to the n-type diffusion layer 2b. Accordingly, the current of negative carriers flows from the n-type diffusion layer 2a to the n-type diffusion layer 2b thereby the switching device Q5 turns ON.

In addition, the switching device Q5 is so designed as to be operative when the discharge pin 13 is grounded and the discharge pin 14 is not grounded and thus floats. In this case, the positive or negative excess high voltage is applied to the wiring 6b. In contrast, the wiring 6a takes the ground potential as is connected to the grounded discharge pin 13. The performance of the switching device Q5 of the first embodiment can be understood from the above descriptions, because the structure of the switching device Q5 is symmetrical. Accordingly, the description of the operation of the switching device Q5 will be omitted.

A second embodiment of the present invention will be described with reference to FIGS. 4A, 4B, 5A and 5B. A structure of a novel protection circuit device of the second embodiment according to the present invention will be described by using an equivalent circuit illustrated in FIG. 4A. The novel protection circuit device of the second embodiment has an analogous structure to that of the first embodiment, except for a novel switching device. The novel protection circuit device, thus, comprises a first protection circuit 100 and a second protection circuit 101, both of which are connected to each other through a switching device Q6.

The first protection circuit 100 is arranged between an input pin 11 and an internal semiconductor integrated circuit device. The first protection circuit 100 of the second embodiment has the same structure as that of the first embodiment, and thus comprises two resistances R1 and R2, two transistors Q1 and Q2, an input pin 11 and a discharge pin 13. The discharge pin 13 is grounded to supply the ground potential.

The second protection circuit 101 is arranged between an input pin 12 and an internal semiconductor integrated circuit device. The second protection circuit 101 of the second embodiment also has the same structure as that of the first embodiment, and thus comprises two resistances R3 and R4, two transistors Q4 and Q3, an input pin 12 and a discharge pin 14. The discharge pin 14 is grounded to supply the ground potential.

The first and second protection circuits 100 and 101 are electrically connected to each other through the switching device Q6. Hence the switching device Q6 may be regarded as a field effect transistor in view of the equivalent circuits. Such transistor Q6 serving as the switching device is so designed that a gate always takes the same potential as either the discharge pin 13 or the discharge pin 14. Namely, the switching device Q6 of the field effect transistor has the following gate structure. One gate electrode is connected to a wiring line 6a which connects to the discharge pin 13 so as to take the same potential as that of the discharge pin 13. Another gate electrode is connected to a wiring line 6b which connects to the discharge pin 14 so as to take the same potential as that of the discharge pin 14. One of source and drain electrodes is also connected to the wiring line 6a which connects to the discharge pin 13 so as to take the same potential as that of the discharge pin 13. Another of the source and drain electrodes is also connected to the wiring line 6b which connects to the discharge pin 14 so as to take the same potential as that of the discharge pin 14. Then, the switching device Q6 may also be regarded as a field effect transistor having two gate electrodes. Such switching device Q6 is so arranged as to be biased by a difference between potentials of the discharge pins 13 and 14. Namely, the bias to be applied to the switching device Q6 is defined by the potential difference between the discharge pins 13 and 14. Further, the switching device Q6 is so operated as to take the ON state only when the bias voltage applied to the switching device Q6 is larger than a predetermined voltage. When the bias voltage applied to the switching device Q6 is smaller than the predetermined voltage, the switching device Q6 takes the OFF state. The absolute value of the predetermined voltage is so determined as to match a positive excessively high voltage caused by any external factor such as the static electricity. Namely, the switching device Q6 is so designed as to turn ON by an application of a bias voltage corresponding to the excessively high voltage caused by the static electricity.

A normal performance of the novel protection circuit device of the second embodiment is the same as that of the first embodiment. Thus, the detailed description of the operation of the novel protection circuit device will be omitted.

Under the normal state, the first and second protection circuits 100 and 101 are operational independently without an operation of the switching device Q6 connecting between the grounded discharge pins 13 and 14. Thus, under the normal state, the switching device Q6 is not operated. The above normal state, therefore, permits the protection circuit device to exhibit a protection function without operation of the switching device Q6.

However, an abnormal state does not permit the protection circuit device to exhibit a protection function without operation of the switching device Q6. The operation of the protection circuit device under an abnormal state will be described with reference to FIG. 2B but its simplicity is analogous to that of the first embodiment. Under the abnormal state, the discharge pin 13 is not grounded and thus floats, while the discharge pin 14 is grounded. In such a case, the floating discharge pin 13 is unable to supply the ground potential, although the grounded discharge pin 14 is able to supply the ground potential. Then, the first protection circuit 100 is no longer able to exhibit a protection performance but independently, while the second protection circuit 101 is able to exhibit a protection performance.

When a positive excessively high voltage caused by external factors such as the static electricity is applied to the input pin 11, the wiring line 6a and the floating discharge pin 13 respectively take a potential corresponding to the positive excessively high voltage. In contrast, the grounded discharge pin 14 and the wiring line 6b respectively take the ground potential as being grounded, even if a positive excessively high voltage is applied to the input pin 12. Consequently, the switching device Q6 is biased by the positive excessively high voltage which has been applied to the input pin 11. As described above, since the switching device Q6 was so designed as to turn ON only when biased by such positive excessively high voltage, the switching device Q6 turns ON. The turning ON of the switching device Q6 makes the current flow from the wiring line 6b connecting to the floating discharge pin 13 to the wiring line 6b connecting to the grounded discharge pin 14 through the switching device Q6. The current flows to the grounded discharge pin 14 and then is discharged through the grounded discharge pin 14.

Eventually, the above switching device Q6 permits the relatively large current caused by the positive excessively high voltage applied to the input pin 11 to be discharged through the grounded discharge pin 14. Even if the excessively high voltage which should be discharged is applied to the inoperative first protection circuit 100, the novel protection circuit device including the switching device Q6 which connects the first and second protection circuits 100 and 101 with each other is able to accomplish the discharge of the current by using the operative second protection circuit 101 without using the inoperative protection circuit 100. This prevents the large current from being supplied to the internal semiconductor integrated circuit provided with the inoperative protection circuit 100. This makes the internal semiconductor integrated circuit provided with the inoperative first protection circuit 100 free from the breakdown due to an application of the large current. The novel protection circuit device is able to exhibit the protection performance, even if the excessively high voltage caused by the external factors such as the static electricity is supplied not only to the operative second protection circuit 101 but also to the inoperative first protection circuit 100.

Eventually, the above switching device Q6 permits the relatively large current caused by the positive excessively high voltage supplied to the input pin 11 to be discharged through the grounded discharge pin 14. Even if the excessively high voltage which should be discharged is supplied to the inoperative first protection circuit 100, the novel protection circuit device including the switching device Q6 is able to accomplish the discharge of the current by using the operative second protection circuit 101 without using the inoperative protection circuit 100. This prevents the large current from being supplied to the internal semiconductor integrated circuit provided with the inoperative protection circuit 100. This makes the internal semiconductor integrated circuit provided with the inoperative first protection circuit 100 free from the breakdown due to an application of the large current. The novel protection circuit device is, therefore, able to exhibit the protection performance, even if the excess high voltage caused by the external factors such as the static electricity is supplied not only to the operative second protection circuit 101 but also to the inoperative first protection circuit 100.

Accordingly, from the above descriptions of the second embodiment, it can be understood that the novel protection circuit device is able to exhibit the protection performance, when the positive excessively high voltage is supplied to the inoperative protection circuit 100.

Figure 5A:
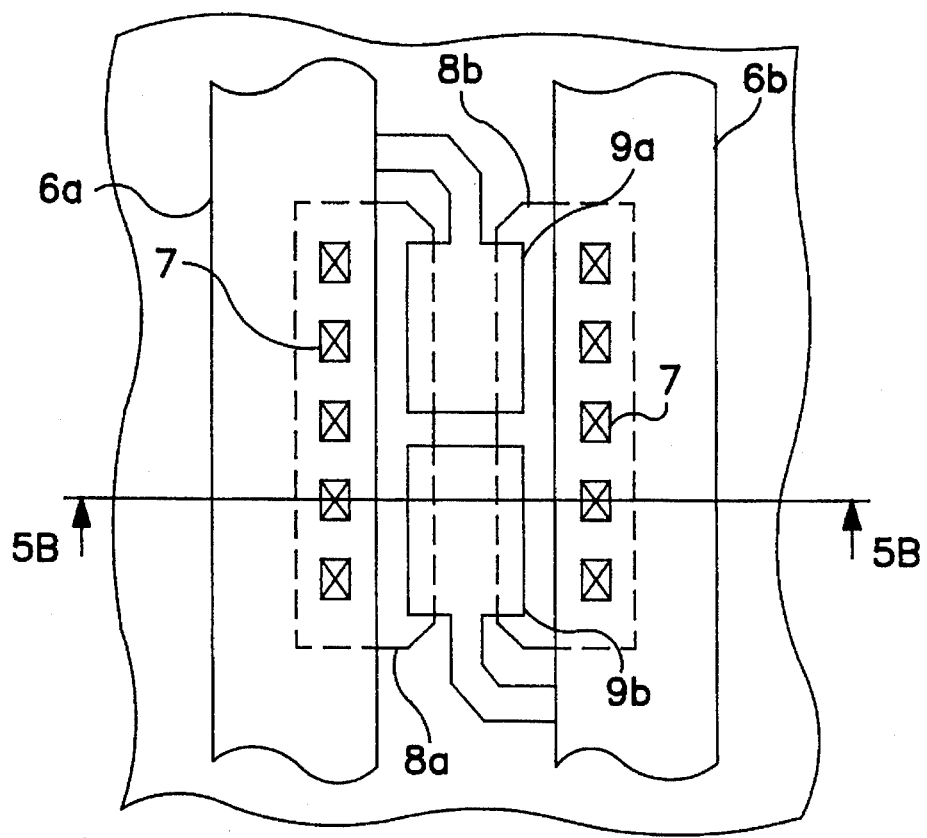
FIG. 5A is a plan view illustrative of a novel semiconductor switching device involved in a protection circuit device in a second embodiment according to the present invention.
Figure 5B:
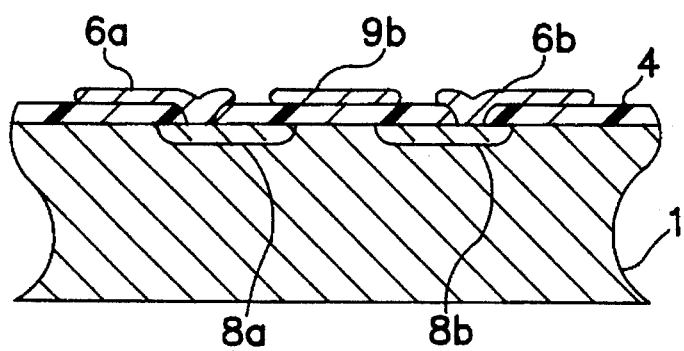
FIG. 5B is a fragmentary cross sectional elevation view taken along B—B' line, which is illustrative of a novel semiconductor switching device involved in a protection circuit device in a second embodiment according to the present invention.

In addition, the novel switching device Q6 will be described with reference to FIGS. 5A and 5B. As can be understood from the above descriptions, it is required that the above switching device Q6 is operative against the positive bias voltage. Thus, the switching device Q6 is operated by the positive bias. Further, the switching device Q6 is required to exhibit a turning ON performance only when applied with a positive excessively high voltage generated by external factors such as the static electricity.

The structure of the novel switching device Q6 of the first embodiment according to the present invention will be described with reference to FIGS. 5A and 5B. The switching device Q6 has a p-type silicon substrate 1. Diffusion layers 8a and 8b doped with an n-type dopant are formed on a main surface of the p-type silicon substrate 1. The n-type diffusion layers 8a and 8b are also so formed as to be separate from but near to each other thereby defining a channel length. The n-type diffusion layers 8a and 8b serve as source and drain regions. An insulation film 4 is formed on an entire surface of the device. Contact holes are respectively formed in portions of the insulation film 4 directly over the n-type diffusion layers 8a and 8b. Source and drain electrodes which are made of a polycrystalline silicon film are respectively formed in the contact holes so as to contact with the n-type diffusion layers 8a and 8b serving as the source and drain regions. The source and drain electrodes are separated from each other. Further, the source and drain electrodes are respectively so formed as to be united with the wiring lines 6a and 6b. The switching device Q6 of the second embodiment further has two gate electrodes 9a and 9b. The gate electrodes 9a and 9b are respectively connected to the source and drain electrodes united with the wiring lines 6a and 6b, but the gate electrodes 9a and 9b are separated from each other. The two gate electrodes 9a and 9b define two channel regions. Namely, surface regions of the p-type silicon substrate 1 directly under the two gate electrodes 9a and 9b serve as the channel regions.

The operation of the switching device Q6 under the abnormal state of the protection circuit device of the second embodiment will be described with reference to FIGS. 5A and 5B.

The wiring 6a takes the same potential as that of the discharge pin 13 because it is connected to the discharge pin 13. When the discharge pin 13 is not grounded and thus floats, the wiring 6a takes the same potential as the excessively high voltage supplied to the input pin 11. In contrast, the wiring 6b takes the same potential as that of the discharge pin 14 because it is connected to the discharge pin 14. When the discharge pin 14 is grounded to supply the ground potential, the wiring 6b takes the ground potential because it is connected to the grounded discharge pin 14. The operation of the switching device Q6 is analogous to that of the field effect transistor except that the switching device Q6 is operative under biases to both the electrodes. The detailed description of the operation of the switching device Q6 will be omitted because the operation of the field effect transistor has been well known in the art, to which the present invention pertains.

Under the zero bias condition, the switching device Q6 takes the OFF state as is well known.

When the positive excessively high voltage is applied to the input pin 11, the wiring 6a also takes a positive high potential corresponding to the positive excessively high voltage as the discharge pin 13 floats. The diffusion layer 8a also takes the positive high potential. In contrast, since the discharge pin 14 is grounded, the wiring 6b takes the ground potential. Then, the n-type diffusion layers 8a and 8b serving as the source and drain regions are biased by the positive excessively high voltage. Further, the gate electrode 9a is also supplied with the positive excessively high voltage as it is connected with the wiring 6a. In contrast, the gate electrode 9b takes the ground potential as it is connected with the wiring 6b. Under such bias condition, an n-type inversion layer is formed but only in the channel region which exists directly under the gate electrode 9a. As a result, the n-type diffusion layers 8a and 8b are conductive. A current of negative carriers or electrons flows from the n-type diffusion layer 8b to the n-type diffusion layer 8a through but only the channel region under the gate electrode 9a. As a result, the switching device turns ON.

In addition, the switching device Q6 is so designed as to be operative even if the discharge pin is grounded and the discharge pin 14 is not grounded and thus floats. When the wiring 6b takes a positive high potential corresponding to the positive excessively high voltage, the diffusion layer 8b also takes the positive high potential. In contrast, the wiring 6a takes the ground potential as it is grounded. Then, the n-type diffusion layers 8a and 8b serving as the source and drain regions are biased by the positive excess high voltage. Further, the gate electrode 9a is also supplied with the positive excessively high voltage as it is connected with the wiring 6b. In contrast, the gate electrode 9a takes the ground potential as it is connected with the wiring 6a. Under such bias condition, an n-type inversion layer is formed but only in the channel region which exists directly under the gate electrode 9b. As a result, the n-type diffusion layers 8a and 8b are conductive. A current of negative carriers or electrons flows from the n-type diffusion layer 8a to the n-type diffusion layer 8b through but only the channel region under the gate electrode 9b. As a result, the switching device turns ON.

Whereas modifications of the present invention will no doubt be apparent to a person of ordinary skill in the art, it is to be understood that the embodiments shown and described by way of illustrations are by no means intended to be considered in a limiting sense. Accordingly, it is to be intended by the following claims to cover all modifications which fall within the spirit and scope of the invention.

What is claimed is:

1. A semiconductor device comprising:

first and second signal pins;

first and second power supply pins;

a first internal circuit coupled to said first signal pin and operating on a power voltage of said first power supply pin;

a first protective circuit coupled between said first signal pin and said first power supply pin, which, when rendered operative, discharges first charges at said first signal pin to said first power supply pin to protect said first internal circuit;

a second internal circuit coupled to said second signal pin and operating on a power voltage of said second power supply pin;

a second protective circuit coupled between said second signal pin and said second power supply pin, which, when rendered operative, discharges second charges at said second signal pin to said second power supply pin to protect said second internal circuit; and switching means coupled between said first and second power supply pins, wherein, should disconnection of said power supply voltage occur at one of said first and second power supply pins, said switching means is rendered conductive, said switching means thus preventing an associated one of said first and second protective circuits from discharging an associated one of said first and second charges, said switching means thereby allowing said associated one of said first and second protective circuits to discharge said associated one of said first and second charges to the other of said first and second power supply pins through said switching means, said switching means comprising:

a semiconductor substrate of a first conductivity type;

first and second diffusion layers of a second conductivity type formed separately from and near to each other in a surface region of said semiconductor substrate;

an insulation film formed on surfaces of said first and second diffusion layers and said semiconductor substrate;

first and second electrodes formed on said first and second diffusion layers respectively, said first and second electrodes being respectively connected to said first and second protection circuits; and first and second gate electrodes formed on said insulation film over a channel region in said semiconductor substrate between said first and second diffusion regions, said first and second gate electrodes being respectively connected to said first and second electrodes, said first and second gate electrodes being spaced apart from each other.

* * * * *